United States Patent [19]

Lynk, Jr. et al.

[11] Patent Number: 4,761,829
[45] Date of Patent: Aug. 2, 1988

[54] ADAPTIVE SIGNAL STRENGTH AND/OR AMBIENT NOISE DRIVEN AUDIO SHAPING SYSTEM

[75] Inventors: Charles N. Lynk, Jr., Bedford, Tex.; Gerald P. Labedz, Chicago, Ill.

[73] Assignee: Motorola Inc., Schaumburg, Ill.

[21] Appl. No.: 802,641

[22] Filed: Nov. 27, 1985

[51] Int. Cl.$^4$ .......................... H03J 15/00; H03J 1/16
[52] U.S. Cl. .................................. 455/307; 455/213; 455/312
[58] Field of Search ............... 455/307, 213, 249, 312, 455/266, 340, 186; 381/94

[56] References Cited

U.S. PATENT DOCUMENTS

| | | |
|---|---|---|
| 2,120,998 | 2/1936 | Barber . |
| 2,136,664 | 1/1936 | Barber . |
| 2,293,274 | 8/1942 | Barber . |
| 3,989,897 | 11/1976 | Carver . |
| 4,127,874 | 11/1978 | Iwasawa ............................ 455/307 |
| 4,244,056 | 1/1981 | Hamada et al. .................... 455/307 |
| 4,326,297 | 4/1982 | Sato et al. ......................... 455/213 |
| 4,340,780 | 7/1982 | Odlen . |
| 4,355,414 | 10/1982 | Inoue . |
| 4,368,541 | 1/1983 | Evans ................................ 455/340 |
| 4,379,207 | 4/1983 | Kubota . |
| 4,388,731 | 6/1983 | King ................................. 455/312 |
| 4,466,133 | 8/1984 | Price ................................. 455/340 |
| 4,475,170 | 10/1984 | Hague . |
| 4,484,358 | 11/1984 | Iwahashi . |
| 4,517,602 | 5/1985 | Murphy III et al. ............... 455/249 |
| 4,519,084 | 5/1985 | Langseth . |
| 4,549,312 | 10/1985 | Michaels et al. .................. 455/307 |
| 4,590,611 | 5/1986 | Maier et al. ....................... 455/186 |
| 4,682,230 | 7/1987 | Perlman et al. ................... 455/307 |

FOREIGN PATENT DOCUMENTS

| | | | |
|---|---|---|---|
| 0201423 | 11/1983 | Japan ................................. | 455/307 |
| 448716 | 6/1936 | United Kingdom . | |

OTHER PUBLICATIONS

"MOS Switched-Capacitor Filters" by Robert W. Brodersen et al. Proceedings of the I.E.E.E., vol. 67, No. 1, Jan. 1979, pp. 61-75.

Primary Examiner—Robert L. Griffin
Assistant Examiner—Curtis Kuntz
Attorney, Agent, or Firm—Donald B. Southard

[57] ABSTRACT

An adaptive audio filter system is disclosed which comprises a filter means capable of producing a plurality of frequency response characteristics. A control signal generating means provides a control signal to the filter means to enable a particular frequency response. The control signal is based upon the signal to noise ratio.

20 Claims, 3 Drawing Sheets

ADAPTIVE SIGNAL STRENGTH AND/OR AMBIENT NOISE DRIVEN AUDIO SHAPING SYSTEM

TECHNICAL FIELD

This invention relates to an adaptive audio shaping system for a radio receiver which is driven by either the received signal strength of the input signal or the ambient noise. Specifically, the invention relates to an audio filter system with a plurality of frequency response outputs which are selected in accordance with predetermined signal to noise ratios and/or ambient noise level.

BACKGROUND OF THE INVENTION

Conventional radio receivers contain an audio filter which is designed to accomplish a particular objective, Typical objectives include; improving the signal to noise ratio, increasing the intelligibility of the audio output signal when a weak signal is received, or tailoring the audio response to meet certain prescribed listening conditions. It would be virtually impossible to accomplish all of the design objectives in the design of a single audio filter. Tradeoffs would have to be made so as to accomplish the main design objective while optimizing secondary objectives. Quite often the design objectives may conflict. For instance, a filter designed to provide optimal audio fidelity at strong signal levels may result in poor articulation at weak signal levels. Thus, the audio filter incorporated in a conventional radio receiver may be merely designed for a single design objective which is optimized for one particular S/N ratio. In addition, accomplishing multiple objectives may require a filter system with a plurality of frequency response characteristics as opposed to one which merely requires varying the bandwidth. This would be virtually impossible with any single active or passive filter.

There are numerous audio filters in the art which accomplish a single design objective. For example, U.S. Pat. No. 4,484,358 to Iwahashi teaches using an audio filter with a predetermined frequency response characteristic which is comprised of a switched capacitor filter wherein the bandpass of the filter is varied in response to the control signal applied thereto. A signal is picked from the IF section of the receiver. This signal is used to provide a pulse signal for clocking the switched capacitor filter. Varying the frequency of the clock signal will vary the passband of the filter but not the frequency response characteristic. The signal picked up from the IF section is one which has not been amplitude limited. When the amplitude of such signal is below a certain threshold level, the clock pulses are deactivated.

Similar to Iwahashi, U.S. Pat. No. 4,379,207 to Kubota discloses an audio filter for an FM stereo receiver which is controlled by the amplitude of the signal picked up from the IF section of the receiver. In accordance with this invention, depending on the amplitude of the signal from the IF section, high frequency noise is filtered out by way of the audio filter.

U.S. Pat. Nos. 2,293,274, 2,120,998 and 2,136,664 to Barber are examples of adaptive audio filters with a single frequency response characteristic but with a variable passband.

While each of these audio filters is designed to accomplish a single design objective such as improving fidelity, they are not adaptable to accomplishing more than one design objective nor a plurality of frequency response characteristics based upon a plurality of signal strengths.

SUMMARY OF THE INVENTION

In accordance with the present invention an adaptable audio filter system adaptable to providing a plurality of frequency response characteristics is disclosed for use in a radio receiver. The audio filter system comprises a switchable filter means and a control signal generating means for generating a control signal which is related to the signal to noise ratio of the input signal or the ambient noise level.

In the one embodiment, the audio filter system has four modes of operation which correspond to weak, medium, or strong signal conditions or a noisy ambient environment condition. The use of a particular mode is determined by the signal to noise ratio which, in turn, enables a particular frequency response characteristic.

In this embodiment the filter means comprises a plurality of filters each connected in series to an electronic switch. The series combination of each switch and filter are connected in parallel so as to connect a single filter to the receiver circuit at one time in response to a signal from the control signal generating means.

Each filter response is adaptable to accomplishing a particular objective, such as optimum fidelity or articulation. Since a plurality of frequency response characteristics are possible in practicing the instant invention, several competing design objectives can be met.

In an alternate embodiment, a plurality of narrow passband filters are combined so as to comprise a filter with a composite frequency response characteristic. These filters are formulated dependent upon particular signal strength at various frequencies to mask out noise.

Numerous other advantages and features of the present invention will become readily apparent from the following description of the invention and its various embodiments, from the claims and from the accompanying drawings.

DETAILED DESCRIPTION OF THE INVENTION

Figure 1:
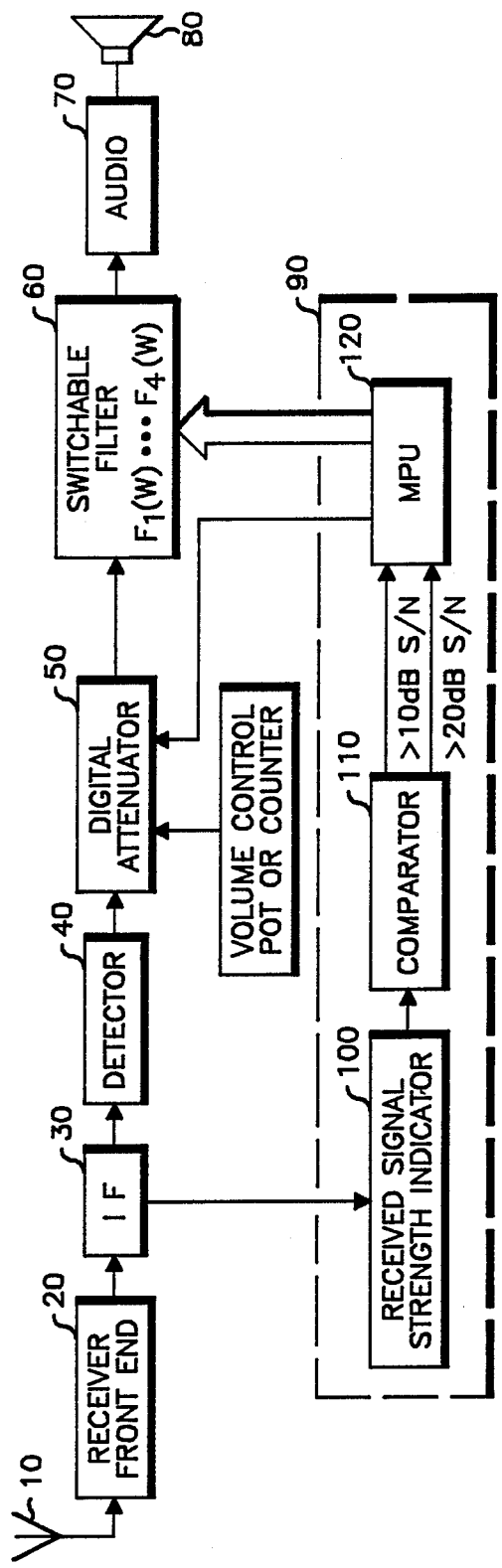
FIG. 1 is a block diagram of a radio receiver embodying an adaptive audio filter system in accordance with the present invention.

While this invention is susceptible to embodiments in many different forms, there is shown in the drawings, which will herein be described in detail, a preferred embodiment of the invention. It should be understood, however, that the present disclosure is to be considered as an exemlilfication of the principles of the invention and is not intended to limit the invention to the specific embodiment illlustrated.

Referring to the drawings, FIG. 1 is a block diagram of a radio receiver having an adaptive audio filter in accordance with one embodiment of the present invention is illustrated. A modulated carrier wave comes into the receiver through an antenna 10. The antenna 10 is coupled to a block 20 identified as the receiver front end. The components comprising a receiver front end 20 for a superheterodyne receiver generally comprises a RF preselector and a down converting means. The RF preselector functions to filter the incoming signal such that only signals within the desired RF frequency band are allowed to pass. The down converting means basically converts the incoming RF signal to a lower intermediate frequency (IF). The block identified as 30 relates to the IF section of the receiver. The down converted IF signal is coupled to a detector 40. The detector 40 functions to demodulate the incoming carrier signal and produce an audio signal. The demodulated signal from the detector 40 is an input to an attenuator 50 which is used to control the power level or volume of the audio signal via volume control or counters. The audio signal is then filtered by a filter means 60 which will be described later in more detail and amplified in audio amplifier 70 to a speaker 80.

Conventional filter means comprises a single active or passive filter network which is fixed and provides for a single frequency response. The filter means 60 in accordance with the present invention comprises an audio filter which has a plurality of frequency response outputs which correspond to various modes of operation. Each mode or frequency response is optimized for a particular signal to noise ratio.

In the one embodiment an adaptive filter provides for four modes of operation corresponding to a weak signal, medium signal, strong signal and a noisy ambient. Each mode corresponds to a particular signal to noise (S/N) ratio. The particular S/N ratios selected are determined by knowledge of the internal noise for a particular receiver, Although specific values for S/N will be used in the discussion, it should be understood that these values are used only for illustrative purposes.

The Weak Signal mode is used during conditions where the signal to noise ratio is relatively low; say below 10 dB, During this mode a first filter response $F_1(W)$ is derived to maximize the articulation in the noise.

The second mode of operation corresponds to a Medium Signal Mode. In this mode a second filter frequency response $F_2(W)$ is utilized. This mode corresponds to a higher signal to noise ratio; for example between 10 dB and 20 dB. This response would correspond to the normal Electronics Industry Association (EIA) response.

The third mode of operation corresponds to a Strong Signal condition. In this mode of operation a third filter frequency response $F_3(W)$ is utilized. This response will be optimized for best audio fidelity.

The fourth mode of operation corresponds to a noisy ambient environment. In this mode, the user will normally turn the volume up to or near full power and frequency response $F_4(W)$ will be utilized. This response emphasizes the mid-range and highs and rolls off the low frequencies, thus reducing power level. This audio response may be the same as $F_1(W)$ for maximum articulation.

Of course, as will be clearly understood by those of ordinary skill in the art that the number of modes of operation may be more or less than four as heretofore illustrated. Moreover, although the four modes of operation were based upon specific signal to noise ratios and design objectives, other values and objectives will function equally as well.

The control signal generating means is used to control the particular operating mode. Referring to FIG. 1, the control signal generating means has been enclosed in dashed lines and identified by the numeral 90. It functions to provide a signal to the filter means 60 and the digital alternator 50 based upon the signal to noise ratio of the incoming signal. The control signal generating means 90 is capable of numerous embodiments all of which are contemplated by the present invention. By way of illustration, two embodiments will be described. Essentially, the control signal generating means 90 is comprised of a received signal strength indicator (RSSI)100, a comparator 110 and an output signal means 120 for triggering a particular frequency response of the filter means 60 based upon the relationship of the signal strength of the incoming radio signal and the preselected signal to noise ratio set points.

In the embodiment of FIG. 1, the RSSI 100 is coupled to the IF Section 30 of the receiver. The RSSI 100 provides an output analog signal which is directly related to the strength of the incoming signal to antenna 10. The RSSI 100 is a conventional device. As is known by those skilled in the art, the output from the RSSI 100 corresponds to signal strength and not a signal to noise ratio. As discussed heretofore, the term signal to noise ratio has been used. The signal to noise ratio corresponds to the ratio of the signal plus noise divided by the noise. The noise refers to internal noise of a particular receiver which is known in the art as random electron noise or thermal agitation noise of the electronic components within the receiver. The internal noise of a receiver is measurable and is relatively fixed.

The output signal from the RSSI 100 is coupled to a comparator circuit means 110. This comparator compares the input signal from the RSSI 100 and provides an output signal based upon the relationship therebetween. The output signal from the comparator 110 control provides a signal to the filter means 60. As is well within the ordinary skill in the art, the present invention contemplates a comparator circuit which is capable of receiving a plurality of input signal levels from the RSSI 100 and providing a plurality of output levels corresponding to the weak, medium and strong signal modes of operation. The comparator means 110 may be comprised of discrete components or be comprised of a monolithic device to provide a plurality of output levels corresponding to a plurality of signal to noise ratio signal inputs; such as less than 10 dB, equal to 10 dB and greater than 20 dB. The comparator circuit 110 will have reference inputs corresponding to each of these signal to noise ratios.

The output signal from the comparator circuit 110 is then used to trigger a particular frequency response of the filter means 60. As illustrated in FIG. 1, the output of the comparator 110 is coupled to a microprocessor 120. The microprocessor 120 provides a control signal to the filter means based upon the signal to noise ratio signal. As will be obvious to those skilled in the art, it is not absolutely necessary that the microprocessor 120 be used specifically for this purpose or even to practice the instant invention. As is within the ordinary skill in the art, the comparator 110 just as easily could be input to a gating circuit (not shown) which could be used to provide a control signal to the filter means 60. However, the microprocessor 120 is illustrated in FIG. 1 due to the fact that modern conventional receivers normally utilize microprocessors for many other reasons outside the scope of the instant invention. Thus, in receivers so equipped, it is more economical and efficient to utilize its microprocessor rather than add gates which increase the cost and decrease the efficiency of the circuit.

The comparator circuit 110 provides three input signals to the microprocessor 120 or other gating circuit which correspond to weak, medium, or strong incoming radio signals. As earlier described the receiver also contains a digital attenuator 50. In a noisy ambient environment, the user may turn up the volume to full or near full power output. During this condition a signal will be received from the digital attenuator 50 by the microprocessor 120. The microprocessor 120 will then provide a signal to filter means 60 to switch in audio response $F_4(W)$.

The filter means 60 is adaptable to many embodiments, all of which are contemplated by the present invention. Essentially the filter means 60 comprises a system adaptable to providing a plurality of frequency response characteristics ($F_1$, $F_2$, etc) upon receipt of a control signal received from the control signal generating means 90.

One such embodiment is a digital signal processor (DSP). These devices are well known in the art and are conventional. ventional. DSP's are high speed microprocessors, often with onboard encoders and decoders for processing signals in the voice band range in real time. In terms of the instant invention, these devices are adaptable to providing a plurality ty of frequency response outputs in real time dependent upon their program and input signals thereto. As contemplated by the present invention, the control signal generating means 90 would provide a signal to the DSP corresponding to the receiver signal to noise ratio for dictating a particular frequency response characteristic.

DSP's which are suitable for the present invention would include those manufactured by NEC and TI. The particular frequency response characteristics for the adaptive filter system would be dependent upon the particular design objectives to be accomplished. Once the particular design objectives are selected, the DSP could be programmed by one of ordinary skill in the art to accomplish those objectives. As will be apparent to those of ordinary skill, DSP's are not essential to the practice of the invention described herein and are mentioned only as being contemplated by the instant invention.

Figure 2:
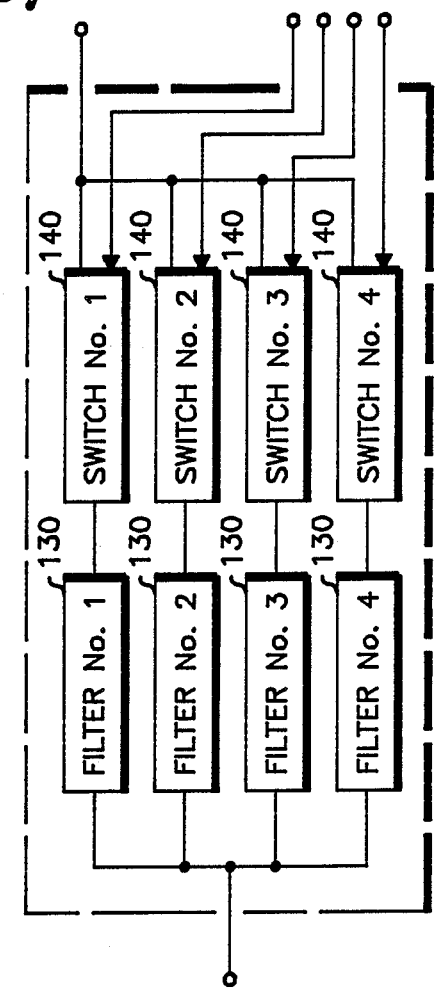
FIG. 2 is a block diagram of one embodiment of the audio filter system shown in FIG. 1.

Another embodiment would include use of a plurality of discrete filters switchably connected to the receiver as shown in FIG. 2. In this embodiment individual filter means 130 are each coupled in series to a plurality of electronic switches 140, designated S1, S2, etc. The combination of filters 130 and switches 140 are opened or closed depending on the control signal received from the control signal generating means 90. When switch S1 is closed, filter F1 would be connected to the receiver and switches S2, S3 and S4 would be open etc. The switches used are conventional electronic switches which are adaptable to changing states dependent upon a control signal applied thereto.

Numerous filter circuits could be used for filters F1, F2, F3 and F4, both of the active and passive design. For example, discrete RC filter circuits could be adapted in the practice of the invention.

The invention also contemplates the use of active filters as an embodiment of the filter circuits depicted in FIG. 2. One such example would be a plurality of switched active filters utilizing operational amplifiers.

Figure 3:
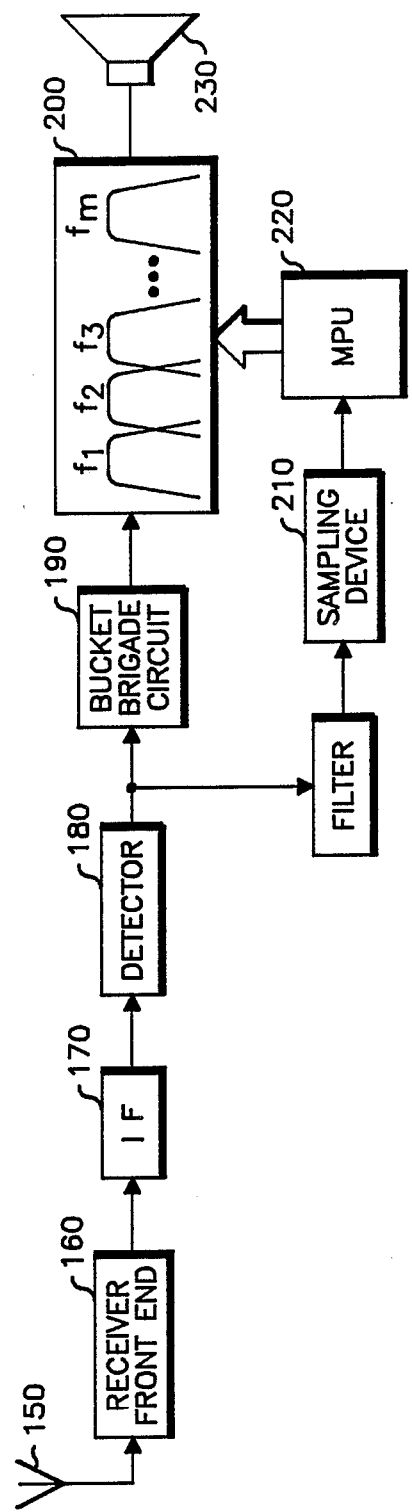
FIG. 3 is a block diagram of an alternate embodiment of a receiver embodying an adaptive audio filter system in accordance with the present invention.

An alternate embodiment of the present invention is illustrated in FIG. 3. In this embodiment, the signal, after the detector section 180, is split into two paths. In the first path, the signal is delayed by way of a bucket brigade circuit 190 before being routed through the adaptive audio filter 200 and broadcast out the speaker 230. In the other path, the signal is sampled and analyzed. A control signal is generated based upon the signal energy of the audio signal frequency components to provide a control signal to the adaptive audio filter 200.

In this embodiment a plurality of filters 130, as depicted in FIG. 2, are switched on to form a composite waveform. The composite filter functions to filter out frequencies with a low signal energy.

More specifically, a signal is received by antenna 150 and proceeds to detector 180. The description of the receiver front end 160, IF section 170 and detector 180 is the same as heretofore described. The signal is then sampled by a suitable sampling device 210. Such sampling may be accomplished by a set of conventional voltage limiters, one for each frequency band of interest. If voltage limiters are used, it is further preferable to also use a low pass or bandpass filter 215 preceeding each limiter. This filter 215 will improve system performance in most applications.

The signal output from the limiter will be essentially rectangular. The rectangular waveform from the sampling device is applied to the microprocessor 220 and sampled at a fixed sampling rate. The sampling rate must be high enough to permit adequate sampling of the highest frequency to be detected as the rectangular waveform is sampled. As the microprocessor samples the rectangular waveform, the input waveform is essentially digitized. A conventional A/D converter could also have been used for the digitizing.

The digitized samples represent the energy of the audio signal at particular frequencies. The microprocessor 220 looks at each frequency band to determine which have energy above a certain threshold level. Those frequency bands with energy below the threshold level represent a low signal to noise ratio and are masked out by the switchable composite filter 200.

Referring to FIG. 3, a plurality of narrow pass filters are combined in parallel to comprise a filter 200 with a composite waveform which masks out frequency bands where the signal to noise ratio is below a preselected value.

In the alternate embodiment, a plurality of narrow band pass filters F1, F2, up to Fm are combined at one time whereas in the earlier mentioned embodiment only one filter of the set 130 at a time is used. Of course, all of the embodiments for a switchable filter means 60 heretofore described are also contemplated for the alternate embodiment.

Figure 4:
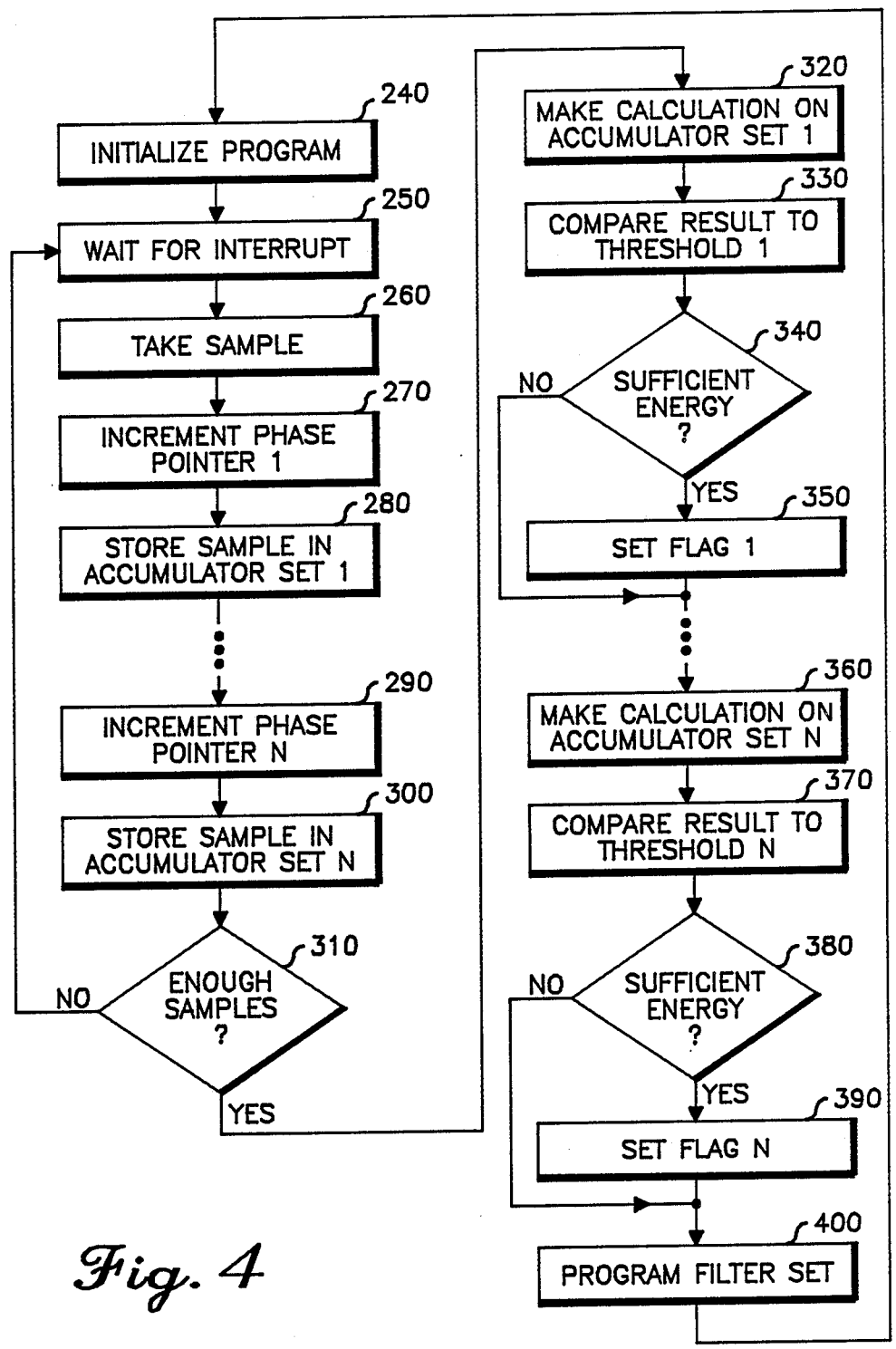
FIG. 4 is a flow diagram of the program for the alternate embodiment of FIG. 3.

FIG. 4 represents a general program flow diagram for the microprocessor 220 shown in FIG. 3 a necessary element for only the alternate embodiment. The system is initialized in step 240. This step sets the initial values and triggers the initial operation of the program sequence. Subsequently the program proceeds to step 250. The step 250 provides the necessary delay between operations so that the samples are taken at proper intervals. During the waiting period the microcomputer can be used to perform other functions. After the necessary delay has occurred, the program proceeds to the sample block 260. The samples are taken 260 and then assigned to a phase subregion in a designated accumulator 280 which is assigned for each frequency band. The phase accumulator is incremented 270 and used to address one of four memory locations corresponding to the four phase quadrants. Each sample is then added to the contents of the memory location addressed for that sample. This program loops until a predetermined number of samples have been taken. Once it is determined a sufficient number of samples have been taken 310, the program proceeds to step 320. In this step a computation is made to determine if there is sufficient energy in each frequency band. The program proceeds to step 330 where comparison is made to a threshold value for a particular frequency band for each accumulator. If there is sufficient energy 340, a flag is set 350. These steps are repeated for N accumulators 360, 370, 380, 390. Responsive to the flag inputs, a plurality of filters 130 are switched on to comprise a composite waveform which filters out noise by masking frequency bands which have a low energy level.

The audio signal is delayed while the computations are made by a bucket brigade circuit 190. Bucket brigade delay circuits are well known in the art and can be comprised of a plurality of J-K type flip-flops wherein the "J" inputs are connected to be always high and the "K" inputs are connected to be always low. The clock inputs for all of the flip-flops are tied together. In operation, the output of each flip flop will be high until a reset pulse is applied. This will force the output of the first stage low. With succeeding pulses to the reset input, the low will be passed in bucket brigade fashion to each succeeding flip-flop on the negative going transitions of the clock signal. The amount of delay is dependent upon the number of stages or flip-flops.

The time interval over which samples are taken and analyzed would have to be constant and used to fix the delay of the bucket brigade circuit. It is also contemplated that a differentiator circuit could be used to change the delay and decide times.

It should be apparent that a unique adaptive filter means is disclosed. This apparatus is readily constructed from conventional hardware. Moreover, while the invention is described in conjunction with a specific embodiment, it should be apparent that there are alternatives, modifications and variations that fall within the spirit and broad scope of the appended claims.

We claim:

1. An adaptive audio filter arrangement for a radio receiver having RF, IF, detector, and audio sections comprising:
   means, interposed between the detector and the audio sections, for providing a plurality of filter responses dependent upon a control signal applied thereto, including at least switchable filter means; and
   control signal generating means, coupled to said means for providing a plurality of filter responses and the IF section, for providing at least one of a plurality of available control signals which are related to the signal to noise ratio of the receiver for effecting one of the plurality of frequency responses thereof.

2. An adaptive audio filter arrangement for a radio receiver as described in claim 1, wherein said means for providing a plurality of filter responses includes means for attenuating the audio signal therethrough, such as a digital attenuator.

3. An adaptive audio filter arrangement for a radio receiver as described in claim 1, wherein said filter means comprises a plurality of passive audio filters which are alternately switchably connected to said receiver and selected according to the control signal from said control signal generating means.

4. An adaptive audio filter arrangement as described in claim 1, wherein said filter means has four predetermined operating modes based upon the control signal from said control signal generating means.

5. An adaptive audio filter arrangement for a radio receiver as described in claim 1, wherein said control signal generating means generates two available control signals, a first control signal indicative of a received signal to noise ratio greater than 10 dB, and a second control signal indicative of a received signal to noise ratio greater than 20 dB.

6. An adaptive audio filter arrangement for a radio receiver as described in claim 1, wherein said filter means comprises a plurality of active audio filters, such as filters utilizing operational amplifiers, which are alternately switchably connected to said receiver and selected according to the control signal from said control signal generating means.

7. An adaptive audio filter arrangement for a radio receiver as described in claim 1, wherein said control signal generating means comprises:
   received signal strength indicator means operatively coupled to said radio receiver for providing an output signal directly related to the radio received signal strength; and
   comparator means coupled to said received signal strength indicator means for comparing the strength of the radio signal to at least one predetermined value and providing an output signal based upon the relationship between a magnitude of the radio recevied signal strength and the predetermined value.

8. An adaptive audio filter arrangement for a radio receiver as described in claim 7, wherein said control signal generating means includes:
   microprocessor means coupled to said comparator means, for processing said comparator output signal for providing a control signal to said filter means.

9. An adaptive audio filter arrangement for a radio receiver as described in claim 1, wherein said means for providing a plurality of filter responses comprises digital signal processor means.

10. An adaptive audio filter arrangement for a radio receiver as described in claim 1, wherein said control signal generating means further includes means for detecting the audio power level set by an included digital attenuator and volume control which indicates usage in a noisy ambient environment, for effecting a preferred one of a plurality of switchable filter responses.

11. An adaptive audio filter arrangement for a radio receiver as described in claim 7, wherein said received signal strength indicator means is electrically coupled to the IF section of the receiver for providing an output signal related to the received signal strength of the receiver for providing an output signal to related the received signal to noise ratio.

12. An adaptive audio filter arrangement for a radio receiver as described in claim 7, wherein said received signal strength indicator means is electrically coupled to the detector section of the receiver for providing an output signal related to the radio received signal strength.

13. An adaptive audio filter arrangement for a radio receiver having a front end, IF, and detector sections for providing an audio signal from the detector to a speaker, comprising:
   means for delaying the audio signal from the detector to an included switchable filter means, said switchable filter means for effecting a composite filter response from a plurality of narrow bandpass filters dependent upon a control signal applied thereto; and
   control signal generating means for determining the signal energy of frequency components in the audio signal from said detector and for generating the control signal which is coupled to said switchable filter means for effecting a composite filter response only for frequencies having signal energy above a certain threshold level.

14. The adaptive audio filter arrangement according to claim 13, wherein said means for delaying the audio signal includes a bucket brigade circuit, such as a plurality of J-K flip-flops.

15. The adaptive audio filter arrangement according to claim 13, wherein said switchable filter means includes a plurality of narrow bandpass filters combined in parallel at one time, from among those designated $f_1$, $f_2$, to $f_m$.

16. The adaptive audio filter arrangement according to claim 13, wherein said control signal generating means includes means for sampling, such as a set of voltage limiters, preceded by a plurality of optional filters at the input thereof, one for each frequency band represented by f1, f2, up to fm.

17. The adaptive audio filter arrangement according to claim 13, wherein said means for sampling comprises digital signal processor means at the input thereof.

18. The adaptive audio filter arrangement according to claim 13, wherein said control signal generating means includes means for sampling, such as a conventional A/D converter.

19. The adaptive audio filter arrangement according to claim 13, wherein said control signal generating means includes means for analyzing, such as a microprocessor, programmed for analyzing the signal energy of frequency components of the audio signal and generating a control signal therefrom.

20. An adaptive audio filter arrangement for a radio receiver having a front end, IF, and detector sections for providing an audio signal from the detector to a speaker, comprising:
   a bucket brigade circuit for delaying the audio signal from the detector;
   a plurality of narrow bandpass filters, coupled to said bucket brigade circuit and switchably connected to said receiver for effecting a composite filter response dependent upon a control signal applied thereto;
   a sampling device, such as a set of conventional voltage limiters preceded by a filter, for determining the signal energy of frequency components in the audio signal by sampling and storing the audio signal from said detector; and
   a microprocessor, programmed for analyzing the signal energy of frequency components of the audio signal stored by said sampling device and generating a control signal therefrom, for effecting a composite filter response only for frequencies having signal energy above a certain threshold level.

* * * * *